(12) United States Patent
Kuwazawa

(10) Patent No.: US 6,476,436 B1
(45) Date of Patent: Nov. 5, 2002

(54) SEMICONDUCTOR DEVICE AND METHOD FOR MANUFACTURING THE SAME

(75) Inventor: Kazunobu Kuwazawa, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/487,914

(22) Filed: Jan. 19, 2000

(30) Foreign Application Priority Data

Jan. 19, 1999 (JP) .......................................... 11-010719

(51) Int. Cl.[7] .............................................. H01L 27/108
(52) U.S. Cl. ........................ 257/306; 257/302; 257/303; 257/307; 438/393; 438/396; 438/395; 438/250
(58) Field of Search ............................... 257/532, 296, 257/302, 303, 396, 306, 307, 252; 438/396, 532, 393, 394, 395, 250, 251, 238

(56) References Cited

U.S. PATENT DOCUMENTS 5,045,966 A * 9/1991 Alter ........................... 361/313
5,208,597 A * 5/1993 Early et al. .................. 341/172
6,313,006 B1 * 11/2000 Hsue et al. .................. 438/407

* cited by examiner

Primary Examiner—Sara Crane
Assistant Examiner—Donghee Kang
(74) Attorney, Agent, or Firm—Hogan & Hartson, L.L.P.

(57) ABSTRACT

A semiconductor device has a first capacitor component and a second capacitor component on a silicon substrate. In the semiconductor device, the first capacitor component has a first lower electrode composed of an impurity-doped polycrystal silicon film, a first insulation film formed on the first lower electrode, and a first upper electrode formed on the first insulation film. The second capacitor component has a second lower electrode formed from an impurity-doped polycrystal silicon film having an impurity concentration different from an impurity concentration of the polycrystal silicon film of the first lower electrode, a second insulation film formed on the second lower electrode and a second upper electrode formed on a second insulation film.

20 Claims, 2 Drawing Sheets

SEMICONDUCTOR DEVICE AND METHOD FOR MANUFACTURING THE SAME

BACKGROUND OF THE INVENTION

1. Field of the Invention

The present invention generally relates to a semiconductor device having a capacitor component and a method for manufacturing the same. More particularly, the present invention relates to a semiconductor device having a capacitor component whose capacitance can be changed through changing the process, without changing the design, and a method for manufacturing the semiconductor device.

2. Description of Related Art

When two capacitor components having different capacitances are formed in a chip in a conventional semiconductor device, areas of capacitance electrodes for the two capacitor components are made different from one another.

More specifically, a first insulation film is formed on a silicon substrate and a polycrystal silicon film is deposited on the first insulation film. Then, a resist film is provided on the polycrystal silicon film, and the polycrystal silicon film is etched, using the resist film as a mask. As a result, first and second lower electrodes made of the polycrystal silicon film are formed on the first insulation film. Let us assume that areas of portions that become capacitance electrodes for the respective first and second lower electrodes are different from one another.

Then, impurities are ion-implanted in the first lower electrode and the second lower electrode with a predetermined dose. As a result, the impurity is introduced in the first lower electrode and the second lower electrode with the same impurity concentration. Then, a second insulation film (dielectric film) is formed on the first and the second lower electrodes. A polycrystal silicon film is deposited on the second insulation film. Then, a resist film is provided on the polycrystal silicon film, and the polycrystal silicon film is etched, using the resist film as a mask. As a result, a first upper electrode of the polycrystal silicon film is formed over the first lower electrode through the second insulation film, and a second upper electrode of the polycrystal silicon film is formed over the second lower electrode through the second insulation film. The semiconductor device is thus manufactured with the two capacitor components of different capacitances formed in one chip.

However, in the conventional semiconductor device described above, in order to form two capacitor components having different capacitances in one chip, areas of the lower electrodes are varied depending on the required capacitances. Therefore, when the capacitance of at least one of the two capacitor components is changed, the area of the lower electrode needs to be changed in the capacitor component whose capacitance is to be changed. In order to make such a change, a photomask that is used for patterning the lower electrode has to be redesigned and remanufactured. Consequently, a substantial cost is required to change the capacitances.

SUMMARY OF THE INVENTION

In accordance with one embodiment of the present invention, a semiconductor device includes a first capacitor component and a second capacitor component on a semiconductor substrate. The first capacitor component includes a first lower electrode formed from an impurity-doped polycrystal silicon film, a first insulation film formed on the first lower electrode and a first upper electrode formed on the first insulation film. The second capacitor component includes a second lower electrode formed from an impurity-doped polycrystal silicon film with an impurity concentration different from an impurity concentration of the impurity in the polycrystal silicon film of the first lower electrode, a second insulation film formed on the second lower electrode and a second upper electrode formed on the second insulation film.

In accordance with an additional embodiment, a first LOCOS oxide film is formed between the first capacitor component and the semiconductor substrate, and a second LOCOS oxide film is formed between the second capacitor component and the semiconductor substrate. In accordance with a further embodiment, an impurity is introduced into the first lower electrode and the second lower electrode by thermal diffusion.

In the semiconductor device embodiments described above, the amount of impurity introduced in the first lower electrode is different from the amount of impurity introduced in the second lower electrode, such that capacitances of the first capacitor component and the second capacitor component are different from one another. In the conventional semiconductor device, the area where the lower electrode and the upper electrode overlap each other has to be changed in order to change the capacitance of the capacitor component. However, in accordance with the present invention, the capacitance of the capacitor component can be changed by changing the amount of impurity that is introduced in the lower electrode, without changing the areas of the electrodes.

In the semiconductor device embodiments described above, from the viewpoint of design simplicity, the upper surface of the first lower electrode may preferably have the same area as that of the upper surface of the second lower electrode. Further, an impurity of a first dose may preferably be introduced in the first lower electrode, and an impurity of a second dose may preferably be introduced in the second lower electrode, by ion-implantation, respectively. Preferably, the first dose may be different from the second dose.

Also, from the viewpoint of dielectric strength characteristic, implementation of higher capacitance and stabilization of film quality, at least one of the first insulation film and the second insulation film may preferably be formed from an ONO film. The ONO film has a layered structure including an oxide film, a nitride film and an oxide film. Also, the first upper electrode and the second upper electrode may preferably be made of polycrystal silicon films.

Other features and advantages of the invention will be apparent from the following detailed description, taken in conjunction with the accompanying drawings that illustrate, by way of example, various features of embodiments of the invention.

DESCRIPTION OF PREFERRED EMBODIMENTS

One embodiment of the present invention will be described with reference to the accompanying drawings.

Figure 1:
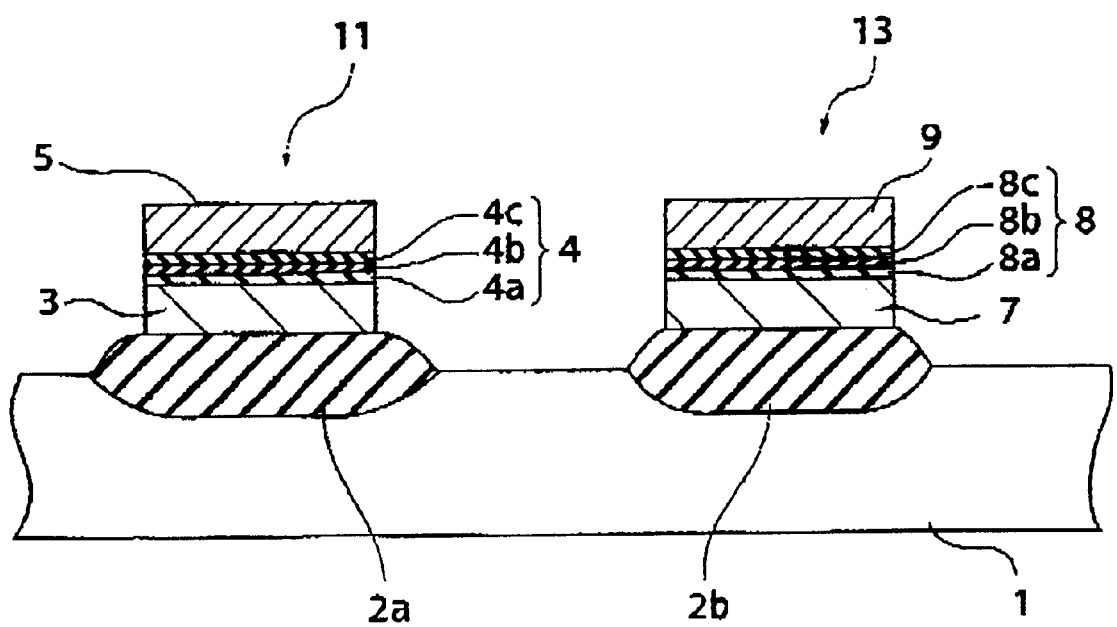
FIG. 1 schematically shows a cross-section of a semiconductor device in accordance with one embodiment of the present invention.

FIG. 1 is a cross-sectional view of a semiconductor device in accordance with the embodiment of the present invention.

First and second LOCOS oxide films 2a and 2b are formed on a silicon substrate 1. The first and second LOCOS oxide films 2a and 2b may be formed as follows. A silicon nitride film (not shown) having openings for forming LOCOS oxide films is formed on the silicon substrate 1, and then the silicon substrate 1 is subjected to thermal oxidation using the silicon nitride film as a mask to thereby form the first and second LOCOS oxide films 2a and 2b.

Then, a polycrystal silicon film is deposited to a film thickness of about 1700 angstrom on the first and the second LOCOS oxide films 2a and 2b and the silicon substrate 1 by a CVD (Chemical Vapor Deposition) method. A resist (not shown) is coated on the polycrystal silicon film, and then the resist is exposed using a photomask to develop. The polycrystal silicon film is etched using the resist film as a mask to thereby form a first lower electrode 3 and a second lower electrode 7 on the first LOCOS oxide film 2a and the second LOCOS oxide film 2b, respectively. Each of the first and the second lower electrodes 3 and 7 has an upper surface having a lateral length of about 320 $\mu$m by a transverse length of about 320 $\mu$m.

An impurity, such as, for example, phosphorous (P) is ion-implanted in the first lower electrode 3 with a dose of $4.5 \times 10^{15}/cm^2$. An acceleration voltage at this ion-implantation is 35 KeV. Then, an impurity, such as, for example, phosphorous (P) is ion-implanted in the second lower electrode 7 with a dose of $8 \times 10^{15}/cm^2$. An acceleration voltage at this time is 35 KeV.

Then, a first ONO film 4 and a second ONO film 8 are formed on the first lower electrode 3 and the second lower electrode 7, respectively. More specifically, a first $SiO_2$ film 4a and a second $SiO_2$ film 8a are formed on the first lower electrode 3 and the second lower electrode 7, respectively, by thermal oxidation. Then, a first $Si_3N_4$ film 4b and a second $Si_3N_4$ film 8b are formed on the first $SiO_2$ film 4a and the second $SiO_2$ film 8a, respectively. A third $SiO_2$ film 4c and a fourth $SiO_2$ film 8c are formed on the first $Si_3N_4$ film 4b and the second $Si_3N_4$ film 8b, respectively. In this manner, the ONO films 4 and 8 as dielectric films are formed.

A polycrystal silicon film is deposited on the entire surface including the first and the second ONO films 4 and 8 by a CVD method. A resist (not shown) is coated on the polycrystal silicon film, and the resist is exposed using a photomask, and developed. The polycrystal silicon film is etched using the resist film as a mask to thereby form a first upper electrode 5 over the first lower electrode 3 through the first ONO film 4 and a second upper electrode 9 over the second lower electrode 7 through the second ONO film 8.

Thus, a first capacitor component 11 having the first lower electrode 3, the first ONO film 4 as a dielectric film and the first upper electrode 5, and a second capacitor component 13 having the second lower electrode 7, the second ONO film 8 as a dielectric film and the second upper electrode 9 are formed on the silicon substrate 1.

In accordance with the above-described embodiment, the ONO films 4 and 8 are formed as dielectric films between the first and the second upper electrodes 5 and 9 and the first and the second lower electrodes 3 and 7, respectively. In another embodiment, silicon oxide films may be formed as the dielectric films. In this case, silicon oxide films are formed on the first and the second lower electrodes 3 and 7, respectively, by thermal oxidation. In a preferred embodiment, the thermal oxidation may be conducted at 750° C., for oxidation time of 45 minutes, under pressure of 1 atm and in a 30% wet atmosphere.

Also, in accordance with the above-described embodiment of the present invention, the impurity is ion-implanted in the first and the second lower electrodes. However, an impurity can be introduced in the first and the second lower electrodes by any one of other methods, such as, for example, thermal diffusion in a $POCl_3$ atmosphere and the like.

In accordance with the above-described embodiment, the amount of an impurity that is ion-implanted in the first lower electrode 3 is different from the amount of an impurity that is ion-implanted in the second lower electrode 7. As a result, the capacitance of the capacitor component 11 becomes different from the capacitance of the capacitor component 13 even when the lower electrodes 3 and 7 have the same upper surface area. In the conventional semiconductor device, the size of a lower electrode in a capacitor component needs be changed in order to change the capacitance of the capacitor component. However, in accordance with the embodiments of the present invention, the capacitance of the capacitor component can be changed by changing the amount of impurities that is ion-implanted in the lower electrode. Thus the size of the lower electrode may not need to be changed to change the capacitance of the capacitor. In other words, in the conventional semiconductor devices, changes to the design are required for modifying and re-manufacturing photomasks. In contrast, in accordance with the present invention, changes may be made to the process for manufacturing a semiconductor device. For example, the amount of impurities that is ion-implanted may be changed to change the capacitance of the capacitor component. As a result, the photomasks do not require to be remanufactured for changing the capacitance of the capacitor component, and therefore the cost for changing the capacitance is reduced.

Figure 2:
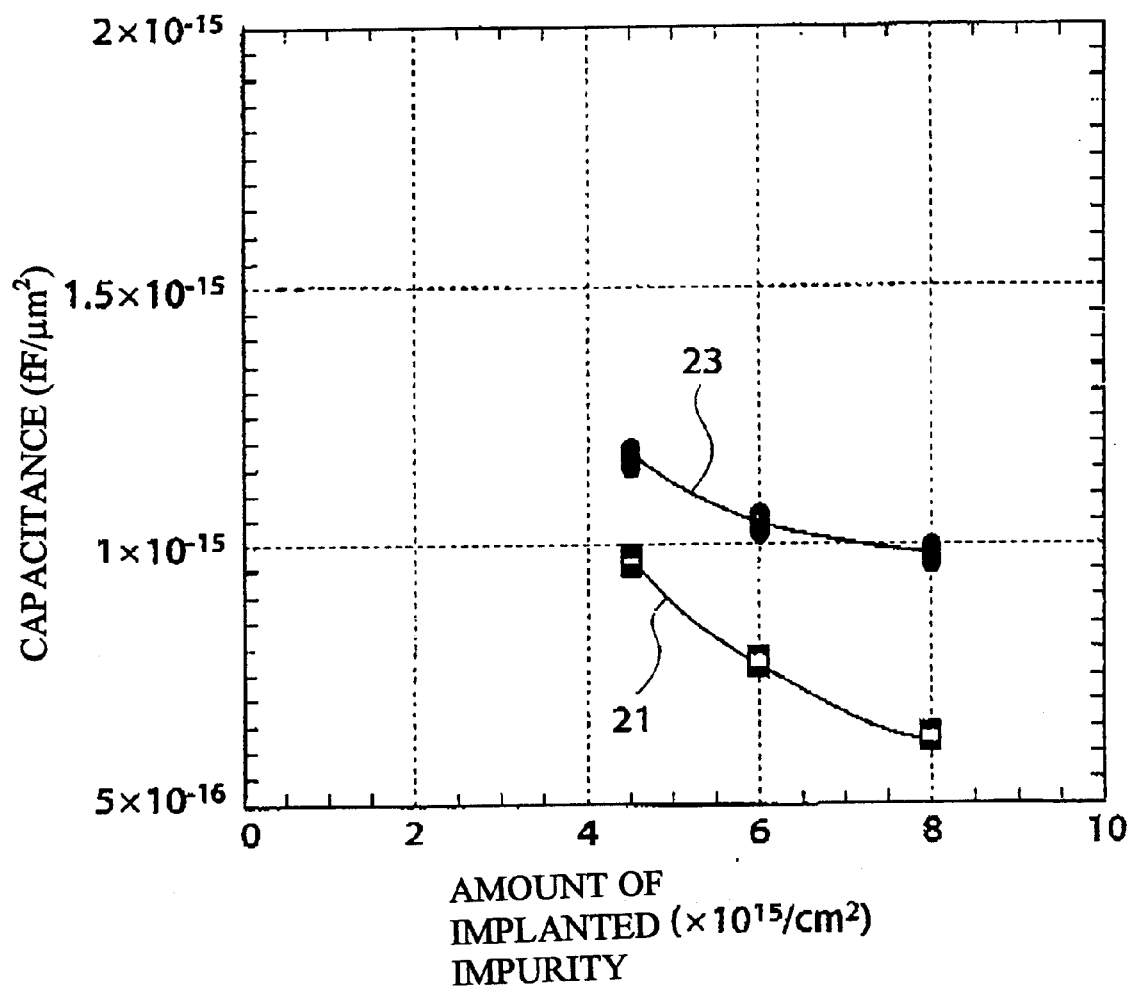
FIG. 2 shows a graph showing the relation between the amount of impurities that is ion-implanted in lower electrodes and the capacitances provided by such ion implantation.

FIG. 2 is a graph showing the relation between the amount (dose) of impurities that are ion-implanted in the lower electrodes and the capacitances provided by such ion-implantation.

Experiment results indicated by reference numeral 21 in the figure represent the relation between doses and capacitances of capacitor components that are manufactured under the following conditions. A lower electrode is formed from a polycrystal silicon film having a thickness of 1200 angstrom. The lower electrode has an upper rectangular surface area of 320 $\mu$m by 320 $\mu$m. Phosphorous (P) is ion-implanted in the lower electrode with an acceleration voltage of 35 KeV. Then, a silicon oxide film is formed on the lower electrode by thermal oxidation at temperature of 750° C., a silicon nitride film having a thickness of 150 angstrom is then formed, and a silicon oxide film is formed by thermal oxidation at temperature of 750° C. As a result, an ONO film composed of these films is formed on the lower electrode. Then, an upper electrode composed of a polycrystal silicon film is formed on the silicon oxide film to thereby provide the capacitor component.

Experimental results indicated by reference numeral 23 in the figure represent the relation between doses and capacitances of capacitor components that are manufactured under the following conditions. A lower electrode is formed from a polycrystal silicon film having a thickness of 1700 angstrom. The lower electrode has an upper rectangular surface area of 320 $\mu$m by 320 $\mu$m. Phosphorous (P) is ion-implanted in the lower electrode with an acceleration voltage of 35 KeV. Then, a silicon oxide film is formed on the lower electrode by thermal oxidation at temperature of 1000° C., a silicon nitride film having a thickness of 150 angstrom is then formed, and a silicon oxide film is formed by thermal oxidation at temperature of 750° C. As a result, an ONO film composed of these films is formed on the lower electrode. Then, an upper electrode composed of a polycrystal silicon film is formed on the silicon oxide film to thereby provide the capacitor component.

According to the results shown in FIG. 2, when the dose of impurity ions introduced in lower electrodes having the same area is increased, the capacitance of each capacitor component is reduced. On the other hand, when the dose of impurity ions is reduced, the capacitance of each capacitor component can be increased. This proves the effects provided by the embodiment of the present invention.

The present invention is not limited to the embodiments described above, and a variety of modifications thereto can be made. For, example, in the above-described embodiment, the upper electrodes 5 and 9 are formed from polycrystal silicon films. However, the upper electrodes can be formed from metal material.

Also, in the above-described embodiments of the present invention, phosphorous (P) is introduced in the lower electrodes 3 and 7. However, other impurities, such as As, B and the like can be introduced in the lower electrodes 3 and 7.

In accordance with the above-described embodiments of the present invention, the amount of an impurity introduced in a first lower electrode is made different from the amount of an impurity introduced in a second lower electrode. Accordingly, the present invention provides a semiconductor device having a capacitor component whose capacitance can be changed by making changes to the process. In other words, the capacitance of a capacitor component in a semiconductor device can be changed without changing the design, for example, of a semiconductor device, components such as photomasks for manufacturing a semiconductor device and the like.

While the description above refers to particular embodiments of the present invention, it will be understood that many modifications may be made without departing from the spirit thereof. The accompanying claims are intended to cover such modifications as would fall within the true scope and sprit of the present invention.

The presently disclosed embodiments are therefore to be considered in all respects as illustrative and not restrictive. The scope of the invention is indicated by the appended claims, rather than the foregoing description, and all changes which come within the meaning and range of equivalency of the claims are therefore intended to be embraced therein.

What is claimed is:

1. A semiconductor device comprising:
   a semiconductor substrate; and
   a first capacitor component and a second capacitor component on the semiconductor substrate,
   the first capacitor component including a first lower electrode formed from an impurity-doped polycrystal silicon film, a first insulation film formed on the first lower electrode and a first upper electrode formed on the first insulation film, and
   the second capacitor component including a second lower electrode formed from an impurity-doped polycrystal silicon film with an impurity concentration different from an impurity concentration of the impurity in the polycrystal silicon film of the first lower electrode, a second insulation film formed on the second lower electrode and a second upper electrode formed on the second insulation film.

2. The semiconductor device according to claim 1, wherein the first lower electrode has an upper surface with an area that is substantially equal to an area of an upper surface of the second lower electrode.

3. The semiconductor device according to claim 1, wherein an impurity is ion-implanted in the first lower electrode with a first dose, and an impurity is ion-implanted in the second lower electrode with a second dose different from the first dose.

4. The semiconductor device according to claim 1, wherein at least one of the first insulation film and the second insulation film is formed from an ONO film.

5. The semiconductor device according to claim 1, wherein the first upper electrode and the second upper electrode are formed from polycrystal silicon films.

6. The semiconductor device according to claim 1, wherein the first capacitor component has a first capacitance and the second capacitor component has a second capacitance different from the first capacitance.

7. The semiconductor device according to claim 3, wherein the impurity ion-implanted in the first lower electrode and the second lower electrode is phosphorous.

8. The semiconductor device according to claim 1, wherein the first upper electrode and the second upper electrode are formed from metal.

9. A semiconductor device comprising:
   a semiconductor substrate;
   a first LOCOS oxide film and a second LOCOS oxide film formed on the semiconductor substrate; and
   a first capacitor component formed on the first LOCOS oxide film and a second capacitor component formed on the second LOCOS oxide film,
   the first capacitor component including a first lower electrode formed from an impurity-doped polycrystal silicon film, a first insulation film formed on the first lower electrode and a first upper electrode formed on the first insulation film, and
   the second capacitor component including a second lower electrode formed from an impurity-doped polycrystal silicon film with an impurity concentration different from an impurity concentration of the impurity in the polycrystal silicon film of the first lower electrode, a second insulation film formed on the second lower electrode and a second upper electrode formed on the second insulation film.

10. The semiconductor device according to claim 9, wherein the first lower electrode has an upper surface with an area that is substantially equal to an area of an upper surface of the second lower electrode.

11. The semiconductor device according to claim 9, wherein an impurity is ion-implanted in the first lower electrode with a first dose, and an impurity is ion-implanted in the second lower electrode with a second dose different from the first dose.

12. The semiconductor device according to claim 11, wherein the impurity ion-implanted in the first lower electrode and the second lower electrode is phosphorous.

13. The semiconductor device according to claim 9, wherein at least one of the first insulation film and the second insulation film is formed from an ONO film.

14. The semiconductor device according to claim 9, wherein the first upper electrode and the second upper electrode are formed from polycrystal silicon films.

15. The semiconductor device according to claim 9, wherein the first capacitor component has a first capacitance and the second capacitor component has a second capacitance different from the first capacitance.

16. The semiconductor device according to claim 9, the first upper electrode and the second upper electrode are formed from metal.

17. A semiconductor device comprising:
   a semiconductor substrate; and
   a first capacitor component and a second capacitor component on the semiconductor substrate,
   the first capacitor component including a first lower electrode formed from an impurity-doped polycrystal silicon film, a first insulation film formed on the first lower electrode and a first upper electrode formed on the first insulation film, and
   the second capacitor component including a second lower electrode formed from an impurity-doped polycrystal silicon film with an impurity concentration different from an impurity concentration of the impurity in the polycrystal silicon film of the first lower electrode, a second insulation film formed on the second lower electrode and a second upper electrode formed on the second insulation film, wherein an impurity is introduced into the first lower electrode by thermal diffusion and an impurity is introduced into the second lower electrode by thermal diffusion.

18. The semiconductor device according to claim 17, wherein the first lower electrode has an upper surface with an area that is substantially equal to an area of an upper surface of the second lower electrode.

19. The semiconductor device according to claim 17, wherein the impurity is introduced into the first lower electrode with a first dose, and the impurity is introduced into the second lower electrode with a second dose different from the first dose.

20. The semiconductor device according to claim 17, wherein the first capacitor component has a first capacitance and the second capacitor component has a second capacitance different from the first capacitance.

* * * * *